(12) United States Patent
Myung et al.

(10) Patent No.: US 8,689,090 B2
(45) Date of Patent: Apr. 1, 2014

(54) APPARATUS AND METHOD FOR CHANNEL ENCODING AND DECODING BASED ON LOW-DENSITY PARITY CHECK CODE IN MULTIPLE ANTENNA COMMUNICATION SYSTEM

(75) Inventors: Se-Ho Myung, Gyeonggi-do (KR); Hong-Sil Jeong, Seoul (KR); Hyun-Koo Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 275 days.

(21) Appl. No.: 13/324,517

(22) Filed: Dec. 13, 2011

(65) Prior Publication Data

US 2012/0173948 A1 Jul. 5, 2012

(30) Foreign Application Priority Data

Jan. 3, 2011 (KR) .................. 10-2011-0000238

(51) Int. Cl.
*H03M 13/03* (2006.01)
(52) U.S. Cl.
USPC ........................................ 714/790; 714/804
(58) Field of Classification Search
USPC .......... 370/335; 714/792, 752, 786, 758, 790, 714/804
See application file for complete search history.

(56) References Cited

U.S. PATENT DOCUMENTS

| | | | |
|---|---|---|---|
| 6,654,928 B1 * | 11/2003 | Terry et al. ................... | 714/792 |
| 7,260,770 B2 * | 8/2007 | Stewart et al. ............... | 714/790 |
| 8,286,048 B1 * | 10/2012 | Chen et al. ................... | 714/752 |
| 8,458,577 B2 * | 6/2013 | Okamura et al. ............ | 714/786 |
| 8,565,194 B2 * | 10/2013 | Gorokhov et al. ........... | 370/335 |
| 2009/0031192 A1 * | 1/2009 | Ha et al. ...................... | 714/758 |

* cited by examiner

*Primary Examiner* — David Ton
(74) *Attorney, Agent, or Firm* — The Farrell Law Firm, P.C.

(57) ABSTRACT

Methods and apparatuses are provided for achieving maximum diversity gain through channel coding based on a Low-Density Parity-Check (LDPC) code in a multiple antenna communication system. A method includes determining a parity-check matrix; generating a codeword using the parity-check matrix; puncturing a part of an information word; dividing a parity into a plurality of partial parities based on a number of transmit antennas; transmitting an unpunctured part of the information word and a partial parity over a first antenna; and transmitting at least one other partial parity over at least one other transmit antenna.

34 Claims, 7 Drawing Sheets

APPARATUS AND METHOD FOR CHANNEL ENCODING AND DECODING BASED ON LOW-DENSITY PARITY CHECK CODE IN MULTIPLE ANTENNA COMMUNICATION SYSTEM

PRIORITY

The present application claims priority under 35 U.S.C. §119(a) to Korean patent application Serial No. 10-2011-0000238, which was filed in the Korean Intellectual Property Office on Jan. 3, 2011, the entire content of which is incorporated herein by reference.

BACKGROUND OF THE INVENTION

1. Field of the Invention

The present invention relates generally to a multiple antenna communication system, and more particularly, to an apparatus and a method for channel encoding and decoding a codeword based on a Low-Density Parity-Check (LDPC) code applying puncturing in the multiple antenna communication system.

2. Description of the Related Art

In a communication system, noises, fading, and Inter-Symbol Interference (ISI) of a channel distort a signal being transmitted. Particularly, in high-speed digital communication systems, such as advanced mobile communication, digital broadcasting, and mobile Internet, requiring high data throughput and high reliability, it is important to overcome signal distortion caused by noise, fading, and ISI. Channel coding and interleaving are some of the techniques for overcoming signal distortion.

Specifically, interleaving is used to prevent burst errors that frequently occur during channel fading, to minimize data transmission loss, and to enhance a channel coding effect, by distributing errors of transmitted bits over multiple points.

The channel coding is often used to enhance communication reliability in that a receiving node can confirm signal distortion caused by noise, fading, and ISI, and efficiently recover the original signal. Codes used in channel coding are often referred to as "Error-Correcting Codes (ECC)".

Conventional ECCs include a parity-check code based on a parity-check matrix. The parity-check code can be defined using a parity-check matrix or a generator matrix. Basically, the parity-check matrix H or the generator matrix G of the parity-check code is given, and a codeword is determined to satisfy a relation as shown in Equation (1).

$$m \cdot G = c$$

$$H \cdot c^T = 0 \quad (1)$$

In Equation (1), m denotes an information word of a length K including K-ary information bits, and $(m_0, m_1, \ldots, m_{K-1})$. H denotes the parity-check matrix, G denotes the generator matrix, and c denotes a codeword obtained from the information word.

When the parity-check matrix is systematic, the codeword c is expressed as (m, p), where p denotes the parity. In general, when a message i.e., an information word) length is K and the codeword length is N, the parity length p is (N−K). With full rank, the size of the parity-check matrix is (N−K)×N.

As for the systematic coding, the parity-check matrix as shown in Equation (2) is possible.

$$H = \begin{bmatrix} 1 & 0 & 0 & 0 & 1 & 0 & 0 & 1 & 0 \\ 0 & 1 & 1 & 0 & 0 & 0 & 0 & 1 & 0 \\ 0 & 1 & 0 & 0 & 0 & 1 & 0 & 0 & 1 \\ 1 & 0 & 0 & 1 & 0 & 0 & 0 & 0 & 1 \\ 1 & 0 & 1 & 1 & 0 & 0 & 1 & 0 & 0 \end{bmatrix} \quad (2)$$

In Equation (2), H denotes the parity-check matrix.

The codeword c corresponding to the parity-check matrix of Equation (2) includes the information word $m=(m_0, m_1, m_2, m_3)$ including four information bits, and the parity $p=(p_0, p_1, p_2, p_3, p_4)$ including five parity bits. The relationship of the codeword c and the parity-check matrix H is shown in Equation (3).

$$H \cdot c^T = \begin{bmatrix} 1 & 0 & 0 & 0 & 1 & 0 & 0 & 1 & 0 \\ 0 & 1 & 1 & 0 & 0 & 0 & 0 & 1 & 0 \\ 0 & 1 & 0 & 0 & 0 & 1 & 0 & 0 & 1 \\ 1 & 0 & 0 & 1 & 0 & 0 & 0 & 0 & 1 \\ 1 & 0 & 1 & 1 & 0 & 0 & 1 & 0 & 0 \end{bmatrix} \cdot \begin{bmatrix} m_0 \\ m_1 \\ m_2 \\ m_3 \\ p_0 \\ p_1 \\ p_2 \\ p_3 \\ p_4 \end{bmatrix} = \underline{0} \quad (3)$$

In Equation (3), H denotes the parity-check matrix, c denotes the codeword, $m_i$ denotes the information bit, and $p_i$ denotes the parity bit.

In the matrix of Equation (3), each row of the parity-check matrix represents an algebraic relational expression. Typically, an algebraic relational expression is referred to as a parity-check equation. Based on Equation (3), the algebraic relational expression is given by Equation (4).

$$\begin{bmatrix} m_0 + p_0 + p_3 \\ m_1 + p_2 + p_3 \\ m_1 + p_1 + p_4 \\ m_0 + p_3 + p_4 \\ m_0 + m_2 + m_3 + + p_2 \end{bmatrix} = \begin{bmatrix} 0 \\ 0 \\ 0 \\ 0 \\ 0 \end{bmatrix} \quad (4)$$

In Equation (4), $m_i$ denotes the information bit and $p_i$ denotes the parity bit.

A nonzero element in the parity-check matrix is referred to as a weight. In general, as the number of the weights increases in the parity-check code, the encoding and decoding complexity rises. That is, the fewer weights in the parity-check matrix, the lower complexity. A code with few weights is referred to as a Low-Density Parity-Check (LDPC) code. In many cases, as the codeword of the LDPC code is lengthened, the weight density lowers.

When the systematic parity-check code is applied to a space-time code, which is a type of multiple antenna system, diversity can occur according to characteristics of the parity-check matrix. The diversity improves the signal quality of each antenna stream by reducing interference between the multiple antennas. As the diversity increases, a higher data rate can be provided.

When an LDPC code is used, the maximum diversity can depend on the characteristics of the parity-check matrix and the transmit antenna for transmitting the codeword. More specifically, a condition of the parity-check matrix for achieving the maximum diversity varies according to whether the parity-check matrix is systematic, and according to the number of the transmit antennas. Accordingly, to achieve maximum diversity using an LDPC in a multiple antenna communication system, it is necessary to define the condition of the parity-check matrix and the distribution criterion of the codeword per transmit antenna.

SUMMARY OF THE INVENTION

The present invention is designed to substantially solve at least the above-described problems and/or disadvantages and to provide at least the advantages below.

Accordingly, an aspect of the present invention is to provide an apparatus and a method for achieving maximum diversity in a space-time code using an LDPC code in a multiple antenna communication system.

Another aspect of the present invention is to provide an apparatus and a method for encoding and decoding using a parity-check matrix that satisfies a condition for maximum diversity in a multiple antenna communication system.

Another aspect of the present invention is to provide an apparatus and a method for transmitting a codeword over a plurality of transmit antennas based on a codeword distribution manner corresponding to a condition for maximum diversity in a multiple antenna communication system.

In accordance with an aspect of the present invention, an operating method of a transmitting node in a multiple-input multiple-output wireless communication system is provided. The method includes determining a parity-check matrix; generating a codeword using the parity-check matrix; puncturing a part of an information word; dividing a parity into a plurality of partial parities based on a number of transmit antennas; transmitting an unpunctured part of the information word and a partial parity over a first antenna; and transmitting at least one other partial parity over at least one other transmit antenna.

In accordance with another aspect of the present invention, an operating method of a receiving node in a multiple-input multiple-output wireless communication system is provided. The method includes receiving a codeword with part of an information word punctured therefrom, over a receive antenna; obtaining an unpunctured part of the information word and a partial parity from the codeword transmitted over a first transmit antenna of a transmitting node; obtaining at least one other partial parity from part of the codeword transmitted over at least one other transmit antenna; rearranging the unpunctured part of the information word and the partial parities; and restoring the information word by decoding the rearranged codeword using a parity-check matrix used by the transmitting node.

In accordance with another aspect of the present invention, an apparatus of a transmitting node in a multiple-input multiple-output wireless communication system is provided. The apparatus includes a controller for determining a parity-check matrix; an encoder for generating a codeword using the parity-check matrix; a puncturing unit for puncturing part of an information word; a distributor for dividing a parity into partial parities based on a number of transmit antennas; and a transmitter for transmitting an unpunctured part of the information word and a partial parity over a first antenna, and transmitting at least one other partial parity over at least one other transmit antenna.

In accordance with another aspect of the present invention, an apparatus of a receiving node in a multiple-input multiple-output wireless communication system is provided. The apparatus includes a receiver for receiving a codeword with part of an information word punctured therefrom, over a receive antenna; an arranger for obtaining an unpunctured part of the information word and a partial parity from the codeword transmitted over a first transmit antenna of a transmitting node, obtaining at least one other partial parity from part of the codeword transmitted over at least one other transmit antenna, and rearranging the unpunctured part of the information word and the partial parities; and a decoder for restoring the information word by decoding the rearranged codeword using a parity-check matrix used by the transmitting node.

BRIEF DESCRIPTION OF THE DRAWINGS

The above and other aspects, features, and advantages of certain embodiments of the present invention will be more apparent from the following detailed description taken in conjunction with the accompanying drawings, in which.

Throughout the drawings, like reference numerals will be understood to refer to like parts, components, and structures.

DETAILED DESCRIPTION OF EMBODIMENTS OF THE INVENTION

Various embodiments of the present invention will be described is detail herein below with reference to the accompanying drawings. In the following description, well-known functions or constructions are not described in detail to avoid obscuring the present invention in unnecessary detail.

In accordance with an embodiment of the present invention, a technique for achieving maximum diversity through space-time coding using an LDPC code in a multiple antenna communication system is provided.

When a transmitting node including two transmit antennas performs space-time coding using a systematic parity-check matrix, diversity can be achieved based on a condition as described below.

A parity-check matrix of a systematic parity-check code can be given by Equation (5).

$$H_A = \left[\begin{array}{c|c} H_I & H_P \\ \hline \text{information word submatrix} & \text{parity submatrix} \end{array}\right] \quad (5)$$

In Equation (5), $H_A$ denotes the parity-check matrix, $H_I$ denotes a submatrix corresponding to an information word, and $H_P$ denotes a submatrix corresponding to a parity.

Based on Equation (5), when an information word length is K and a codeword length is N, the size of the submatrix $H_I$ corresponding to the information word is (N−K)×K and the size of the submatrix $H_P$ corresponding to the parity is (N−K)×(N−K). Because the codeword satisfies the relationship shown in Equation (1), the relational expression of Equation (6) is valid.

$$\begin{aligned} \underline{0} = H_A \cdot \underline{c}^T &= [H_I \ H_P]\begin{bmatrix} \underline{m}^T \\ \underline{p}^T \end{bmatrix} = H_I \cdot \underline{m}^T + H_P \cdot \underline{p}^T \\ &\Leftrightarrow H_P \cdot \underline{p}^T = H_I \cdot \underline{m}^T \\ &\Leftrightarrow \underline{p}^T = (H_P)^{-1} H_I \cdot \underline{m}^T \end{aligned} \quad (6)$$

In Equation (6), $H_A$ denotes the parity-check matrix, c denotes the codeword, $H_I$ denotes the submatrix corresponding to the information word, $H_P$ denotes the submatrix corresponding to the parity, m denotes the information word, and p denotes the parity.

Figure 1:
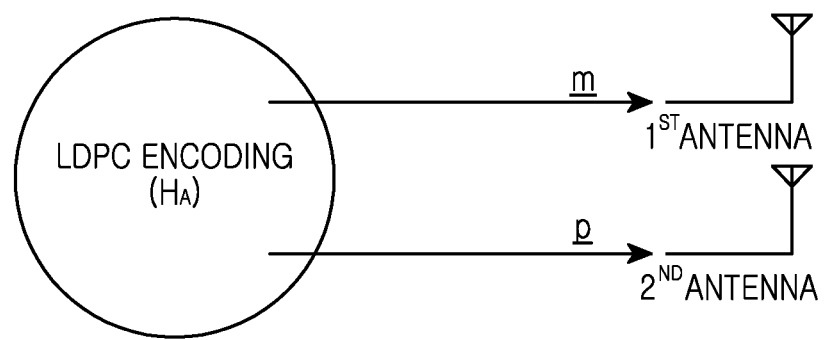
FIG. 1 illustrates codeword transmission in a multiple antenna communication system according to an embodiment of the present invention.

FIG. 1 illustrates codeword transmission in a multiple antenna communication system according to an embodiment of the present invention.

Referring to FIG. 1, the codeword c=(m, p) is transmitted through two antennas. Specifically, in the codeword c=(m, p), which is generated from the parity-check matrix $H_A$, the information word m is transmitted via a first transmit antenna and the parity p is transmitted via a second transmit antenna. To attain maximum diversity, when a 2×K-sized matrix $$C = \begin{bmatrix} \underline{m} \\ \underline{p} \end{bmatrix}$$

corresponding to a random codeword c=(m, p) excluding zero codewords is given, the matrix C should have full rank all the time. For example, the rank of an m×n matrix cannot be greater than m nor n. Further, a matrix that has a rank as large as possible is said to have full rank. Herein, the full rank implies that the same row as a particular row is not derived even by subtracting or adding at least two of the rows of the corresponding matrix.

Accordingly, because the matrix C is in the size of 2×K, full rank of the matrix C is 2. Thus, when searching for a parity-check code that satisfies the condition for achieving maximum diversity, a receiving node using two transmit antennas has the same problem as designing the parity-check matrix in which the rank of the matrix C is not 1 with respect to a random codeword excluding the zero codewords.

Cases where the rank of the matrix C is 1 and conditions of the parity-check matrix $H_A$ for avoiding the corresponding cases are shown in Table 1.

TABLE 1

| Case where rank is 1 | Condition of $H_A$ to avoid case where rank is 1 |
|---|---|
| $\underline{m} \neq \underline{p}, \underline{p} = \underline{0}$ | $H_I$ has the full rank. |
| $\underline{m} = \underline{p}, \underline{p} \neq \underline{0}$ | $H_P$ has the full rank. |
| $\underline{m} = \underline{p} \neq \underline{0}$ | $H_I + H_P$ has the full rank. |

Based on Table 1, in the first case for rank 1, in is not zero and p is zero. When $H_I$ has full rank, $m^T = H_I^{-1} H_P p^T$ is derived from Equation (6). When the parity matrix p is zero, the information word in is also zero. Therefore, the first case for rank 1 in Table 1 is not valid.

In the second case for rank 1, in is zero and p is not zero. When $H_P$ has full rank, $p^T = H_P^{-1} H_I m^T$ is derived from Equation (6). When the information word in is zero, the parity matrix p is also zero. Therefore, the second case for rank 1 in Table 1 is not valid.

In the third case for rank 1, m and p are equal and neither is zero. When m and p are equal and $H_I + H_P$ has full rank, $0 = H_I \cdot m^T + H_P \cdot p^T = (H_I + H_P) m^T$ is derived from Equation (6). When $H_I + H_P$ has full rank, in and p are zero. Therefore, the third case for rank 1 in Table 1 is also not valid.

When satisfying all of the conditions for avoiding the rank 1 in Table 1, the transmitting node can attain the maximum diversity.

Besides the parity-check matrix shown in Equation (5), a system according to an embodiment of the present invention can use a parity-check matrix as shown in Equation (7).

$$H_B = \left[\begin{array}{c|ccc} \text{untransmitted information word submatrix} & & & \\ H_{I1} & H_{I3} & H_{P1} & 0 \\ H_{I2} & 0 & 0 & H_{P2} \\ \hline \text{information word submatrix} & & \text{parity submatrix} & \end{array}\right] \quad (7)$$

In Equation (7), $H_B$ denotes the parity-check matrix, $H_{I1}$, $H_{I2}$, and $H_{I3}$ denote the submatrices corresponding to the information word, and $H_{P1}$ and $H_{P2}$ denote the submatrices corresponding to the parity. Among the submatrices corresponding to the information word, $H_{I1}$ and $H_{I2}$ are the submatrices corresponding to the untransmitted information word. That is, $H_{I1}$ and $H_{I2}$ correspond to the punctured codeword.

The parity-check matrix shown in Equation (7) can be decomposed, where $$\begin{bmatrix} H_{I1} \\ H_{I2} \end{bmatrix}$$

is a submatrix corresponding to part $m_1$ of the information word in a length $K_1$, $$\begin{bmatrix} H_{I3} \\ 0 \end{bmatrix}$$

is a submatrix corresponding to part $m_2$ of the information word in a length $K_2$, $$\begin{bmatrix} H_{P1} \\ 0 \end{bmatrix}$$

is a submatrix corresponding to part p of the parity in a length $(K_1+K_2)$, and $$\begin{bmatrix} 0 \\ H_{P2} \end{bmatrix}$$

is a submatrix corresponding to part $p_2$ of the information word in a length $K_1$. Accordingly, the length of the information word $(m_1, m_2)$ is $(K_1+K_2)$ and the length of the parity $(p_1, p_2)$ is $(2K_1+K_2)$. The size of $H_{I1}$ is $K_1 \times K_1$, the size of $H_{I2}$ is $K_1 \times K_1$, the size of $H_{I3}$ is $(K_1+K_2) \times K_2$, the size of $H_{P1}$ is $(K_1+K_2) \times (K_1+K_2)$, and the size of $H_{P2}$ is $K_1 \times K_1$.

Because the codeword $c=(m_1, m_2, p_1, p_2)$ satisfies $H_B \cdot c^T=0$, a relational expression shown in Equation (8) is established.

$$H_B \cdot \underline{c}^T = \begin{bmatrix} H_{I1} & H_{I3} & H_{P1} & 0 \\ H_{I2} & 0 & 0 & H_{P2} \end{bmatrix} \cdot \begin{bmatrix} m_1^T \\ m_2^T \\ p_1^T \\ p_2^T \end{bmatrix} = \underline{0} \quad (8)$$

In Equation (8), $H_B$ denotes the parity-check matrix, c denotes the codeword, $H_{I1}$, $H_{I2}$, and $H_{I3}$ denote the submatrices corresponding to the information word, $H_{P1}$ and $H_{P2}$ denote the submatrices corresponding to the parity, $m_i$ denotes part of the information word, and $p_i$ denotes part of the parity.

Equation (8) can be arranged as shown in Equation (9).

$$H_{I1} \cdot m_1^T + H_{I3} \cdot m_2^T + H_{P1} \cdot p_1^T = 0$$
$$H_{I2} \cdot m_1^T + H_{P2} \cdot p_2^T = 0 \quad (9)$$

In Equation (9), $H_{I1}$, $H_{I2}$, and $H_{I3}$ denote the submatrices corresponding to the information word, $H_{P1}$ and $H_{P2}$ denote the submatrices corresponding to the parity, $m_i$ denotes part of the information word, and $p_i$ denotes part of the parity.

In the communication system using the parity-check code or the LDPC code corresponding to the parity-check matrix $H_B$ of Equation (7), the transmitting node may puncture, i.e., not transmit, part $m_i$ of the information word of the length $K_1$ in the codeword $c=(m_1, m_2, p_1, p_2)$.

Figure 2:
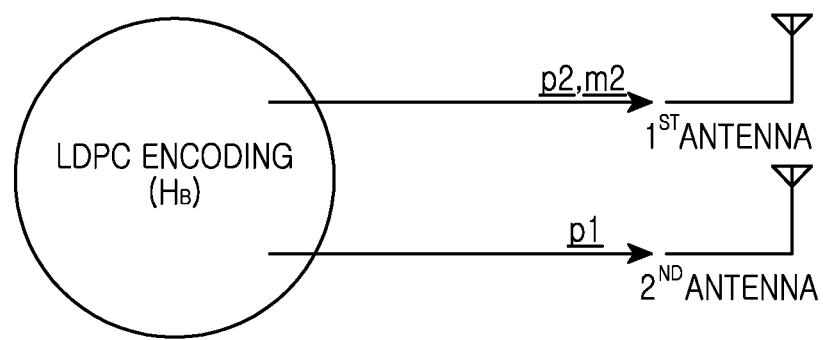
FIG. 2 illustrates a transmission of a punctured codeword over two transmit antennas in a multiple antenna communication system according to an embodiment of the present invention.

FIG. 2 illustrates a transmission of a punctured codeword over two transmit antennas in a multiple antenna communication system according to an embodiment of the present invention.

Referring to FIG. 2, the transmitting node transmits the punctured codeword $c'=(m_2, p_1, p_2)$, where $(p_2, m_2)$ is transmitted over the first transmit antenna and $p_1$ is transmitted over the second transmit antenna. Accordingly, the transmitting node transmits $p_2$ first and then $m_2$ over the first transmit antenna. Because the initial information word length is $(K_1+K_2)$ and the length of the punctured codeword $c'=(m_2, p_1, p_2)$ actually transmitted is $2(K_1+K_2)$, the actual code rate is 1/2. The lengths of $(p_2, m_2)$ transmitted over the first transmit antenna and $p_1$ transmitted over the second transmit antenna are equal to $(K_1+K_2)$.

A condition for attaining maximum diversity in a transmitting node using two transmit antennas will be described below, where the parity-check matrix shown in Equation (7) is used.

A certain punctured codeword $c'=(m_2, p_1, p_2)$, excluding the zero codewords, can be expressed as a matrix $$\begin{bmatrix} (p_2, m_2) \\ p_1 \end{bmatrix}$$

in the size $2 \times (K_1+K_2)$, and the matrix $$\begin{bmatrix} (p_2, m_2) \\ p_1 \end{bmatrix}$$

should have full rank. Given the two transmit antennas, the full rank of the matrix $$\begin{bmatrix} (p_2, m_2) \\ p_1 \end{bmatrix}$$

is 2. Therefore, when the parity-check matrix as shown in Equation (7) is used, determining the parity-check code satisfying the condition for achieving the maximum diversity in the transmitting node using the two transmit antennas is the same problem as designing the parity-check matrix such that the rank of the matrix $$\begin{bmatrix} (p_2, m_2) \\ p_1 \end{bmatrix}$$

is not zero with respect to a random codeword excluding the zero codewords.

When $m_1^T = H_{I2}^{-1} H_{P2} \cdot p_2^T$ is derived from the lower equation of Equation (9) and is applied to the upper equation of Equation (9), $H_{I1} + H_{I2}^{-1} H_{P2} \cdot p_2^T + H_{I3} \cdot m_2^T + H_{P1} \cdot p_1^T = 0$ is derived. The condition of the parity-check matrix $H_B$ for blocking the rank of the matrix $$\begin{bmatrix} (p_2, m_2) \\ p_1 \end{bmatrix}$$

from being 1 is derived from $H_{I1} + H_{I2}^{-1} H_{P2} \cdot p_2^T + H_{I3} \cdot m_2^T + H_{P1} \cdot p_1^T = 0$ as shown below.

More specifically, when $(p_2, m_2)$ is substituted with one vector v, $H_{I1} + H_{I2}^{-1} H_{P2} \cdot p_2^T + H_{I3} \cdot m_2^T + H_{P1} \cdot p_1^T = 0$ is expressed as shown in Equation (10).

$$[H_{I1} H_{I2}^{-1} H_{P2} H_{I3}] \cdot v^T + H_{P1} \cdot p_1^T = 0 \quad (10)$$

In Equation (10), $H_{I1}$, $H_{I2}$, and $H_{I3}$ denote the submatrices corresponding to the information word, $H_{P1}$ and $H_{P2}$ denote the submatrices corresponding to the parity, v denotes $(p_2, m_2)$, $m_i$ denotes part of the information word, and $p_i$ denotes part of the parity.

In the first case for rank 1, v is not zero and $p_1$ is zero. Yet, when $[H_{I1} H_{I2}^{-1} H_{P2} H_{I3}]$ of Equation (10) has the full rank and an inverse matrix, $v^T=[H_{I1}H_{I2}^{-1}H_{P2}H_{I3}]^{-1}\cdot H_{P1}\cdot p_1^T$ is satisfied. At this time, the case where v is not zero and $p_1$ is zero cannot be established.

In the second case for rank 1, v is zero and $p_1$ is not zero. However, when $H_{P1}$ of Equation (9) has full rank and an inverse matrix, $p_1^T = H_{P1}^{-1} \cdot [H_{I1}H_{I2}^{-1}H_{P2}H_{I3}]^{-1}\cdot v^T$ is satisfied. At this time, the case where v is zero and $p_1$ is not zero also cannot be established.

In the third case for rank 1, v and $p_1$ are equal and neither is zero. However, when $[H_{I1}H_{I2}^{-1}H_{P2}H_{I3}]+H_{P1}$ of Equation (9) has full rank, $0=[H_{I1}H_{I2}^{-1}H_{P2}H_{I3}]\cdot v^T+H_{P1}\cdot p_1^T=([H_{I1}H_{I2}^{-1}H_{P2}H_{I3}]+H_{P1})\cdot v^T$ is satisfied. At this time, the case where v and $p_1$ are equal and neither is zero cannot be established.

In the communication system using the parity-check code corresponding to the parity-check matrix $H_B$ as shown in Equation (7), the condition of the transmitting node that punctures part $m_1$ of the $K_1$-length information word of the codeword $c=(m_1, m_2, p_1, p_2)$ and transmits $(p_2, m_2)$ over the first transmit antenna and $p_1$ over the second transmit antenna, for attaining maximum diversity is as explained above. This condition is shown below in Table 2.

TABLE 2

| Case where rank is 1 | Condition of $H_B$ to avoid case where rank is 1 ($\underline{v} = (\underline{p_2}, \underline{m_2})$) |
|---|---|
| $\underline{v} \neq \underline{p_1}, \underline{p_1} = \underline{0}$ | $[H_{I1} + H_{I2}^{-1} H_{P2} H_{I3}]$ has the full rank. |
| $\underline{v} = \underline{p_1}, \underline{p_1} \neq \underline{0}$ | $H_{P1}$ has the full rank. |
| $\underline{v} = \underline{p_1} \neq \underline{0}$ | $[H_{I1} + H_{I2}^{-1} H_{P2} H_{I3}] + H_{P1}$ has the full rank. |

When satisfying all of the conditions for avoiding rank 1 in Table 2, the transmitting node can achieve maximum diversity.

In addition the parity-check matrix of Equation (5) or Equation (7), the system can use a parity-check matrix as shown in Equation (11) using three transmit antennas.

$$H_C = \begin{bmatrix} \overline{\text{untransmitted information word submatrix}} & & & & \\ \overline{H_{I1}} & H_{I3} & H_{P1} & H_{P2} & 0 \\ H_{I2} & 0 & 0 & 0 & H_{P3} \\ \hline \text{information word submatrix} & & & \text{parity submatrix} & \end{bmatrix} \quad (11)$$

In Equation (11), $H_C$ denotes the parity-check matrix, $H_{I1}$, $H_{I2}$, and $H_{I3}$ denote the submatrices corresponding to the information word, and $H_{P1}$, $H_{P2}$ and $H_{P3}$ denote the submatrices corresponding to the parity. Among the submatrices corresponding to the information word, $H_{I1}$ and $H_{I2}$ are the submatrices corresponding to the untransmitted information word, i.e., correspond to the punctured codeword.

The parity-check matrix as shown in Equation (11) can be decomposed, where $$\begin{bmatrix} H_{I1} \\ H_{I2} \end{bmatrix}$$

is a submatrix corresponding to part $m_1$ of a $K_1$-length information word, $$\begin{bmatrix} H_{I3} \\ 0 \end{bmatrix}$$

is a submatrix corresponding to part $m_2$ of a $K_2$-length information word, $$\begin{bmatrix} H_{P1} \\ 0 \end{bmatrix}$$

is a submatrix corresponding to part $p_1$ of a $(K_1+K_2)$-length parity, $$\begin{bmatrix} 0 \\ H_{P2} \end{bmatrix}$$

is a submatrix corresponding to part $p_2$ of a $K_1$-length information word, and $$\begin{bmatrix} 0 \\ H_{P3} \end{bmatrix}$$

is a submatrix corresponding to part $p_3$ of a $K_1$-length information word. Accordingly, the length of the information word $(m_1, m_2)$ is $(K_1+K_2)$ and the length of the parity $(p_1, p_2, p_3)$ is $(3K_1+2K_2)$. The size of $H_{I1}$ is $(2K_1 \times 2K_1) \times K_1$, the size of $H_{I2}$ is $K_1 \times K_1$, the size of $H_{I3}$ is $(2K_1+2K_2) \times K_2$, the size of $H_{P1}$ and $H_{P2}$ is $(2K_1+2K_2) \times (K_1+K_2)$, and the size $H_{P3}$ of is $K_1 \times K_1$.

Because the codeword $c=(m_1, m_2, p_1, p_2, p_3)$ satisfies $H_C \cdot c^T = 0$, Equation (12) is valid.

$$H_C \cdot \underline{c}^T = H_C = \begin{bmatrix} H_{I1} & H_{I3} & H_{P1} & H_{P2} & 0 \\ H_{I2} & 0 & 0 & 0 & H_{P3} \end{bmatrix} \cdot \begin{bmatrix} m_1^T \\ m_2^T \\ p_1^T \\ p_2^T \\ p_3^T \end{bmatrix} = \underline{0} \quad (12)$$

In Equation (12), $H_C$ denotes the parity-check matrix, c denotes the codeword, $H_{I1}$, $H_{I2}$, and $H_{I3}$ denote the submatrices corresponding to the information word, $H_{P1}$, $H_{P2}$ and $H_{P3}$ denote the submatrices corresponding to the parity, $m_i$ denotes part of the information word, and $p_i$ denotes part of the parity.

Equation (12) can be arranged as shown in Equation (13).

$$H_{I1}\cdot m_1^T + H_{I3}\cdot m_2^T + H_{P1}\cdot p_1^T + H_{P2}\cdot p_2^T = 0$$

$$H_{I2}\cdot m_1^T + H_{P3}\cdot p_3^T = 0 \quad (13)$$

In Equation (13), $H_{I1}$, $H_{I2}$, and $H_{I3}$ denote the submatrices corresponding to the information word, $H_{P1}$, $H_{P2}$ and $H_{P3}$ denote the submatrices corresponding to the parity, $m_i$ denotes part of the information word, and $p_i$ denotes part of the parity.

In the communication system using the parity-check code or the LDPC code corresponding to the parity-check matrix $H_C$ of Equation (11), the transmitting node may puncture, i.e., not transmit, the part $m_1$ of the $K_1$-length information word in the codeword $c=(m_1, m_2, p_1, p_2, p_3)$.

Figure 3:
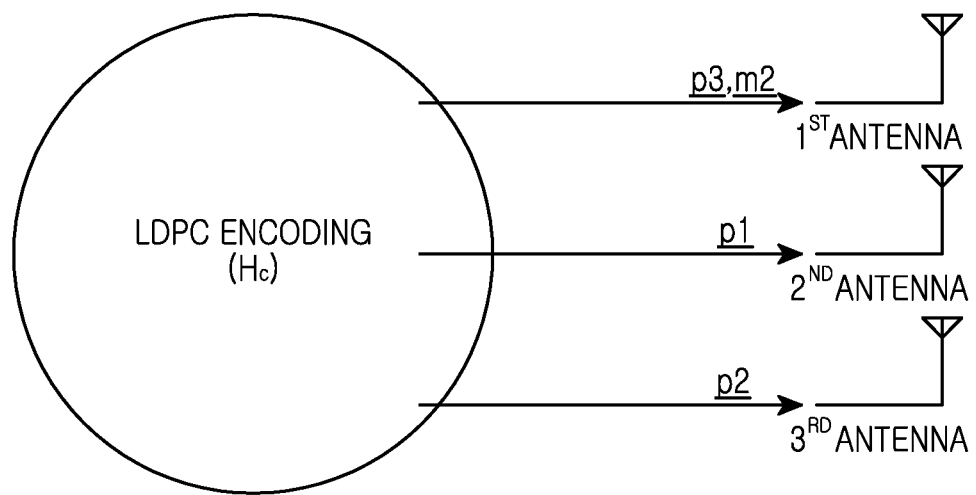
FIG. 3 illustrates a transmission of a punctured codeword over three transmit antennas in a multiple antenna communication system according to an embodiment of the present invention.

FIG. 3 illustrates a transmission of a punctured codeword over three transmit antennas in a multiple antenna communication system according to an embodiment of the present invention.

Referring to FIG. 3, the transmitting node transmits the punctured codeword c'=($m_2$, $p_1$, $p_2$, $p_3$), where ($p_3$, $m_2$) are transmitted over the first transmit antenna, $p_1$ is transmitted over the second transmit antenna, and $p_2$ is transmitted over the third transmit antenna. Accordingly, the transmitting node first transmits $p_3$ and then transmits $m_2$ over the first transmit antenna. Because the initial information word length is 9($K_1$+$K_2$) and the length of the punctured codeword c'=($m_2$, $p_1$, $p_2$, $p_3$) actually transmitted is 3($K_1$+$K_2$), the actual code rate is 1/3. The lengths of ($p_3$, $m_2$) transmitted over the first transmit antenna, $p_1$ transmitted over the second transmit antenna, and $p_2$ transmitted over the third transmit antenna are equal to ($K_1$+$K_2$).

A condition for attaining maximum diversity in a transmitting node using three transmit antennas is described below, when the parity-check matrix of Equation (11) is used.

A random punctured codeword c'=($m_2$, $p_1$, $p_2$, $p_3$), excluding the zero codewords, can be expressed as a matrix $$\begin{bmatrix} (p_3, m_2) \\ p_1 \\ p_2 \end{bmatrix}$$

in the size 3×($K_1$+$K_2$), and the matrix $$\begin{bmatrix} (p_3, m_2) \\ p_1 \\ p_2 \end{bmatrix}$$

should have the full rank. Given the three transmit antennas, the full rank of the matrix $$\begin{bmatrix} (p_3, m_2) \\ p_1 \\ p_2 \end{bmatrix}$$

is 3. Accordingly, when the parity-check matrix of Equation (11) is used, determining a parity-check code that satisfies the condition for achieving maximum diversity in the transmitting node using the three transmit antennas is the same problem as the designing the parity-check matrix such that the rank of the matrix $$\begin{bmatrix} (p_3, m_2) \\ p_1 \\ p_2 \end{bmatrix}$$

is not 1 or 2 with respect to a random codeword excluding the zero codewords.

When $m_1^T = H_{I2}^{-1} H_{P3} \cdot p_3^T$ is derived from the lower equation shown in Equation (13) and is applied to the upper equation shown in Equation (13), $H_{I1} + H_{I2}^{-1} H_{P3} \cdot p_3^T + H_{I3} \cdot m_2^T + H_{P1} \cdot p_1^T + P_{P2} \cdot p_2^T = 0$ is derived. The condition of the parity-check matrix $H_C$ for preventing the rank of the matrix $$\begin{bmatrix} (p_3, m_2) \\ p_1 \\ p_2 \end{bmatrix}$$

from being 1 or 2 is derived from $H_{I1} + H_{I2}^{-1} H_{P3} \cdot p_3^T + H_{I3} \cdot m_2^T + H_{P1} \cdot p_1^T + P_{P2} \cdot p_2^T = 0$ as will be described below.

More specifically, when ($p_3$, $m_2$) is substituted with one vector v, $H_{I1} + H_{I2}^{-1} H_{P2} \cdot p_2^T + H_{I3} \cdot m_2^T + H_{P1} \cdot p_1^T = 0$ is arranged as shown in Equation (14).

$$[H_{I1} H_{I2}^{-1} H_{P2} H_{I3}] \cdot v^T + H_{P1} \cdot p_1^T + H_{P2} \cdot p_2^T = 0 \tag{14}$$

In Equation (14), $H_{I1}$, $H_{I2}$, and $H_{I3}$ denote the submatrices corresponding to the information word, $H_{P1}$, $H_{P2}$ and $H_{P3}$ denote the submatrices corresponding to the parity, v denotes ($p_3$, $m_2$), denotes part of the information word, and $p_i$ denotes part of the parity.

The rank 1 is achieved as follows.

In a first case, where v is not zero and both of $p_1$ and $p_2$ is zero, the rank is 1.

In a second case, where $p_1$ is not zero and both of $p_2$ and v is zero, the rank is 1.

In a third case, where $p_2$ is not zero and both of v and $p_1$ is zero, the rank is 1.

In a fourth case, where v and $p_1$ are equal and neither is zero and $p_2$ is zero, the rank is 1.

In a fifth case, where v and $p_2$ are equal and neither is zero and $p_1$ is zero, the rank is 1.

In a sixth case, where $p_1$ and $p_2$ are equal and neither is zero and v is zero, the rank is 1.

In a seventh case, where all of v, $p_1$ and $p_2$ are equal and neither is zero, the rank is 1.

When $[H_{I1} H_{I2}^{-1} H_{P3} H_{I3}]$ has full rank, the first case cannot be established. When $H_{P1}$ has full rank, the second case cannot be established. When $H_{P2}$ has full rank, the third case cannot be established. When $[H_{I1} H_{I2}^{-1} H_{P3} H_{I3}] + H_{P1}$ has full rank, the fourth case cannot be established. When $[H_{I1} H_{I2}^{-1} H_{P3} H_{I3}] + H_{P2}$ has full rank, the fifth case cannot be established. When $H_{P1} + H_{P2}$ has full rank, the sixth case cannot be established. When $[H_{I1} H_{I2}^{-1} H_{P3} H_{I3}] + H_{P1} + H_{P2}$ has full rank, the seventh case cannot be established.

The rank 2 is achieved as follows.

In a first case, where v and $p_1$ are not zero and $p_2$ is zero, the rank is 2.

In a second case, where v and $p_2$ are not zero and $p_1$ is zero, the rank is 2.

In a third case, where $p_1$ and $p_2$ are not zero and v is zero, the rank is 2.

In a fourth case, where v and $p_1$ are not zero and $p_2$ and v are equal, the rank is 2.

In a fifth case, where v and $p_2$ are not zero and $p_1$ and $p_2$ are equal, the rank is 2.

In a sixth case, where $p_1$ and $p_2$ are not zero and v and $p_1$ are equal, the rank is 2.

In a seventh case, where v and $p_1$ are not zero and $p_2$ and v+$p_1$ are equal, the rank is 2.

When $[H_{I1} H_{I2}^{-1} H_{P3} H_{I3} H_{P1}]$ has full rank, the first case cannot be established. When $[H_{I1} H_{I2}^{-1} H_{P3} H_{I3} H_{P2}]$ has full rank, the second case cannot be established. When $[H_{P1} H_{P2}]$ has full rank, the third case cannot be established. When $[([H_{I1} H_{I2}^{-1} H_{P3} H_{I3}] + H_{P2}) H_{P1}]$ has full rank, the fourth case cannot be established. When $[[H_{I1} H_{I2}^{-1} H_{P3} H_{I3}] (H_{P2} + H_{P1})]$ has full rank, the fifth case cannot be established. When $[([H_{I1}H_{I2}^{-1}H_{P3}H_{I3}]+H_{P1})H_{P2}]$ has full rank, the sixth case cannot be established. When $[([H_{I1}H_{I2}^{-1}H_{P3}H_{I3}]+H_{P1})([H_{I1}H_{I2}^{-1}H_{P3}H_{I3}]+H_{P2})]$ has full rank, the seventh case cannot be established.

In the communication system using the parity-check code corresponding to the parity-check matrix $H_C$ of Equation (11), the condition of the transmitting node that punctures part $m_1$ of the $K_1$-length information word of the codeword $c=(m_1, m_2, p_1, p_2, p_3)$ and transmits $(p_3, m_2)$ over the first transmit antenna, $p_1$ over the second transmit antenna, and $p_2$ over the third transmit antenna for attaining maximum diversity is as described above. More specifically, this condition is shown in Table 3.

TABLE 3

| Case where rank is 1 | Condition of $H_C$ to avoid case where rank is 1 $(\underline{v} = (\underline{p_3}, \underline{m_2}), H_X = R_{I1}H_{I2}^{-1}H_{P3})$ |
|---|---|
| $\underline{v} \neq \underline{0}, \underline{p_1} = \underline{p_2} = \underline{0}$ | $[H_X H_{I3}]$ has the full rank. |
| $\underline{p_1} \neq \underline{0}, \underline{v} = \underline{p_2} = \underline{0}$ | $H_{P1}$ has the full rank. |
| $\underline{p_2} \neq \underline{0}, \underline{v} = \underline{p_1} = \underline{0}$ | $H_{P2}$ has the full rank. |
| $\underline{v} = \underline{p_1} \neq \underline{0}, \underline{p_2} = \underline{0}$ | $[H_X H_{I3}] + H_{P1}$ has the full rank. |
| $\underline{v} = \underline{p_2} \neq \underline{0}, \underline{p_1} = \underline{0}$ | $[H_X H_{I3}] + H_{P2}$ has the full rank. |
| $\underline{p_1} = \underline{p_2} \neq \underline{0}, \underline{v} = \underline{0}$ | $H_{P1} + H_{P2}$ has the full rank. |
| $\underline{v} = \underline{p_1} = \underline{p_2} \neq \underline{0}$ | $[H_X H_{I3}] + H_{P1} + H_{P2}$ has the full rank. |

| Case where rank is 2 | Condition of $H_C$ to avoid case where rank is 2 $(\underline{v} = (\underline{p_3}, \underline{m_2}), H_X = H_{I1}H_{I2}^{-1}H_{P3})$ |
|---|---|
| $\underline{v} \neq \underline{0}, \underline{p_1} \neq \underline{0}, \underline{p_2} = \underline{0}$ | $[H_X H_{I3}\ H_{P1}]$ has the full rank. |
| $\underline{v} \neq \underline{0}, \underline{p_2} \neq \underline{0}, \underline{p_1} = \underline{0}$ | $[H_X H_{I3}\ H_{P2}]$ has the full rank. |
| $\underline{p_1} \neq \underline{0}, \underline{p_2} \neq \underline{0}, \underline{v} = \underline{0}$ | $[H_{P1}\ H_{P2}]$ has the full rank. |
| $\underline{v} \neq \underline{0}, \underline{p_1} \neq \underline{0}, \underline{p_2} = \underline{v}$ | $[([H_X H_{I3}] + H_{P2})\ H_{P1}]$ has the full rank. |
| $\underline{v} \neq \underline{0}, \underline{p_2} \neq \underline{0}, \underline{p_1} = \underline{p_2}$ | $[([H_X H_{I3}])(H_{P1} + H_{P2})]$ has the full rank. |
| $\underline{p_1} \neq \underline{0}, \underline{p_2} \neq \underline{0}, \underline{v} = \underline{p_1}$ | $[([H_X H_{I3}] + H_{P1})\ H_{P2}]$ has the full rank. |
| $\underline{v} \neq \underline{0}, \underline{p_1} \neq \underline{0}, \underline{p_2} = \underline{v} + \underline{p_1}$ | $[([H_X H_{I3}] + H_{P1})\ ([H_X H_{I3}] + H_{P2})]$ has the full rank. |

When satisfying all of the conditions for avoiding the rank 1 and all of the conditions for avoiding the rank 2 in Table 3, the transmitting node can achieve maximum diversity.

As described above, when the parity-check matrix is given, the conditions for attaining maximum diversity can be derived. The condition derivation can be similarly applied to four or more transmit antennas. That is, when one transmit antenna transmits part of the parity and the unpunctured information word, and other transmit antennas transmit the remaining parities in a same length as the length of the parity and the information word transmitted over the one transmit antenna, the conditions of the corresponding parity-check matrix can be derived similarly to the above-described condition derivation.

For example, with respect to the codeword $c=(m_1, m_2, p_1, p_2, \ldots p_{M-1}, p_M)$ including zeros, when the transmitting node applying a space-time code using M-ary transmit antennas punctures $m_1$, transmits $(p_M, m_2)$ over the first transmit antenna, and transmits $p_1, p_2, \ldots p_{M-1}$ over the other (M−1)-ary transmit antennas, the transmitting node can achieve the maximum diversity by designing the parity-check matrix such that $$\begin{bmatrix} (\underline{p_M}, \underline{m_2}) \\ \underline{p_1} \\ \underline{p_2} \\ \vdots \\ \underline{p_{M-1}} \end{bmatrix}$$

has full rank.

Figure 4:
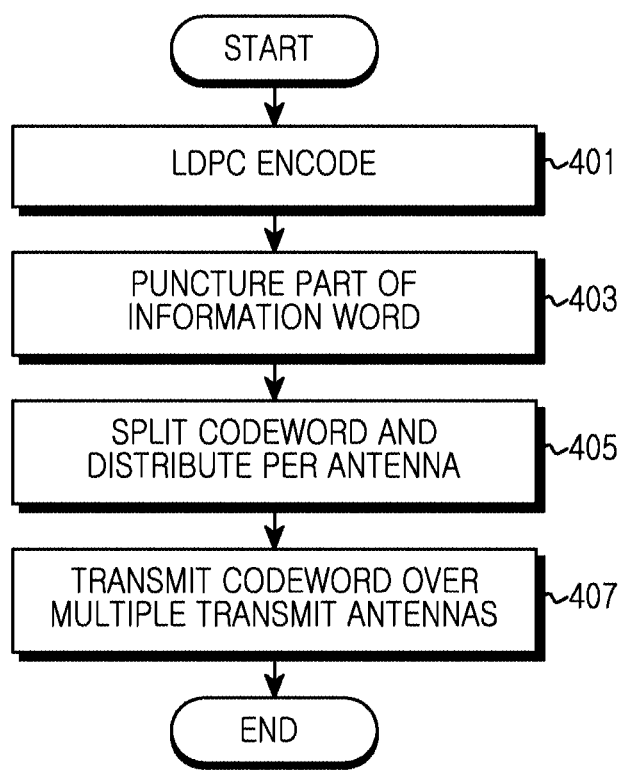
FIG. 4 is a flow chart illustrating an operation of a transmitting node in a multiple antenna communication system according to an embodiment of the present invention.

FIG. 4 is a flow chart illustrating an operation of a transmitting node in a multiple antenna communication system according to an embodiment of the present invention.

Referring to FIG. 4, the transmitting node performs LDPC encoding using a parity-check matrix in step 401. More specifically, the transmitting node determines the parity-check matrix according to the code rate defined in the system, the length of the codeword, the length of the information word, and the number of the transmit antennas. The transmitting node generates or loads the determined parity-check matrix, and determines the parity that makes the product the parity-check matrix and a transpose matrix of the codeword zero.

For example, the transmitting node can use the parity-check matrix shown in Equation (7) or Equation (11). When the parity-check matrix shown in Equation (7) is used, at least one of $[H_{I1}H_{I2}^{-1}H_{P2}H_{I3}]$, $H_{P1}$, and $[H_{I1}H_{I2}^{-1}H_{P2}H_{I3}]+H_{P1}$ of the parity-check matrix has full rank.

When the parity-check matrix shown in Equation (11) is used, at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]+H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}][([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

In step 403, the transmitting node punctures part of the codeword. Specifically, the transmitting node punctures part of the information word. For example, the transmitting node splits the information word to two partial information words, and punctures the first partial information word including a Most Significant Bit (MSB) of the codeword.

In step 405, the transmitting node divides the punctured codeword and distributes the divided codeword fragments to the transmit antennas. That is, the transmitting node divides the punctured partial codeword into the plurality of the fragments and distributes the fragments to the plurality of the transmit antennas.

For example, the transmitting node divides the parity into as many partial parities as there are transmit antennas, and distributes the other partial information word unpunctured and one partial parity to the first transmit antenna and the other partial parities to the remaining transmit antennas. Herein, the length of the other partial parity can equal the length of the other partial information word unpunctured and the one partial parity. The partial parity output to the first transmit antenna path together with the unpunctured information word includes a Least Significant Bit (LSB) of the codeword.

In step 407, the transmitting node transmits the punctured and distributed codeword over the plurality of the transmit antennas according to the distribution in step 405. That is, the transmitting node transmits the other partial information word unpunctured and the one partial parity over the first transmit antenna and transmits the other partial parities over the remaining transmit antennas. Accordingly, the transmitting node first transmits the one partial parity and then transmits the unpunctured information word over the first transmit antennas.

Figure 5:
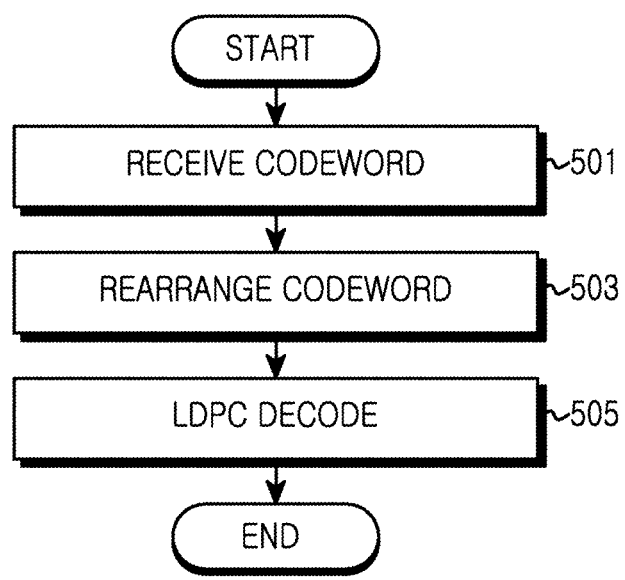
FIG. 5 is a flow chart illustrating an operation of a receiving node in a multiple antenna communication system according to an embodiment of the present invention.

FIG. 5 is a flow chart illustrating an operation of a receiving node in a multiple antenna communication system according to an embodiment of the present invention.

Referring to FIG. 5, in step 501, the receiving node receives the codeword with part of the information word punctured, over at least one receive antenna.

In step 503, the receiving node generates the codeword by rearranging the codeword fragments, which are distributed and transmitted per transmit antenna of the transmitting node. Specifically, the receiving node obtains the unpunctured information word and the partial parity from the partial codeword transmitted over the first transmit antenna of the transmitting node, obtains the other partial parities from the partial codeword transmitted over at least one other transmit antenna, and rearranges the unpunctured information word and the partial parities.

In step 505, the receiving node restores the information word by decoding the rearranged codeword using the parity-check matrix.

More specifically, the receiving node determines the parity-check matrix used by the transmitting node using the received control information, and generates or loads the determined parity-check matrix, and then performs the LDPC decoding. That is, the receiving node determines the information word that makes the product of the parity-check matrix and the transpose matrix of the codeword zero. When part of the codeword is punctured, a decoder decodes on the assumption that the probability of the punctured bit being 0 and the probability of the punctured bit being 1 are equal to ½, or decodes by erasing the punctured bit.

For example, the receiving node can use the parity-check matrix as shown in Equation (7) or Equation (11). When the parity-check matrix as shown in Equation (7) is used, at least one of $[H_{I1}H_{I2}^{-1}H_{P2}H_{I3}]$, $H_{P1}$, and $[H_{I1}H_{I2}^{-1}H_{P2}H_{I3}]+H_{P1}$ of the parity-check matrix has full rank.

When the parity-check matrix as shown in Equation (11) is used, at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]+H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}]$, $[([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

Figure 6:
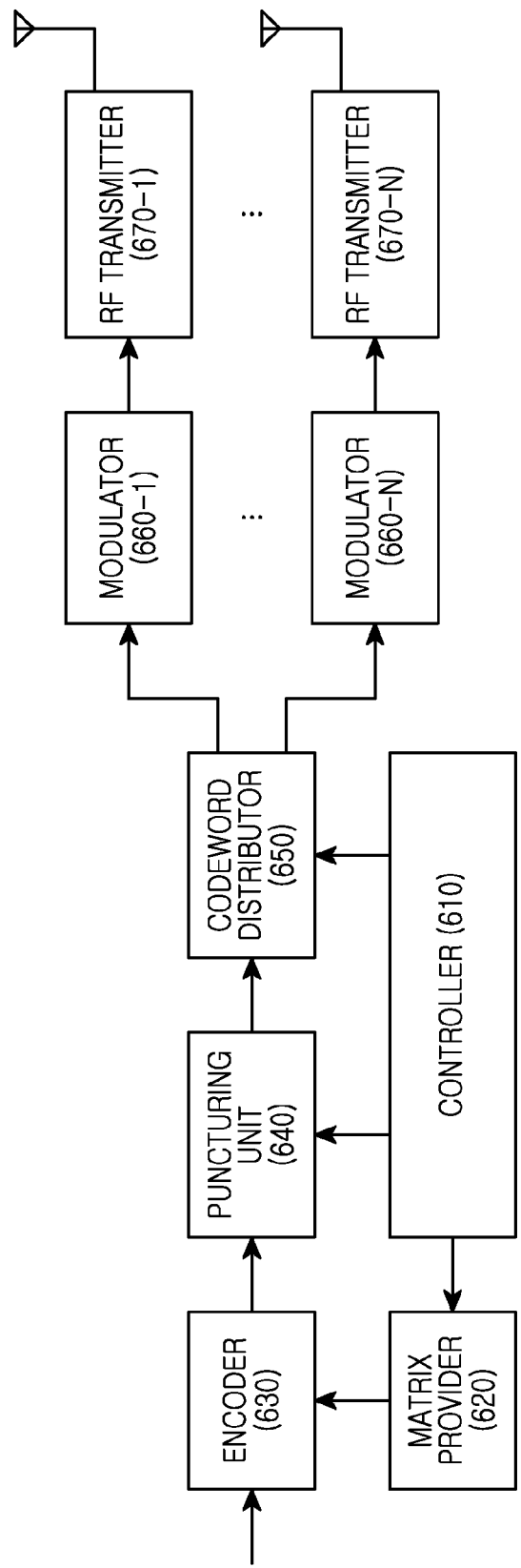
FIG. 6 is a block diagram illustrating a transmitting node in a multiple antenna communication system according to an embodiment of the present invention.

FIG. 6 is a block diagram illustrating a transmitting node in a multiple antenna communication system according to an embodiment of the present invention.

Referring to FIG. 6, the transmitting node includes a controller 610, a matrix provider 620, an encoder 630, a puncturing unit 640, a codeword distributor 650, a plurality of modulators 660-1 through 660-N, and a plurality of Radio Frequency (RF) transmitters 670-1 through 670-N.

The controller 610 determines a parity-check matrix according to a code rate defined in the system, a codeword length, an information word length, and a number of the transmit antennas. The controller 610 controls the puncturing unit 640 to puncture part of the information word. The controller 610 controls the codeword distributor 650 to divide the parity into the partial parities as many as the transmit antennas. The controller 610 controls the codeword distributor 650 to transmit a first signal including a partial information word and a partial parity over the first antenna, and to transmit at least one other partial parities over at least one other transmit antenna besides the first antenna.

The matrix provider 620 provides the parity-check matrix according to the determination of the controller 610. The matrix provider 620 can generate the parity-check matrix according to a predefined rule, or load the parity-check matrix stored in a storage device, e.g., memory, (not shown).

The encoder 630 generates the codeword including the information word and the parity by encoding with the parity-check matrix provided from the matrix provider 620. That is, the encoder 630 determines the parity that makes the product the parity-check matrix and the transpose matrix of the codeword zero.

For example, the encoder 630 can use the parity-check matrix shown in Equation (7) or Equation (11). When the parity-check matrix of Equation (7) is used, at least one of $[H_{I1}H_{I2}^{-1}H_{P2}H_{I3}]$, $H_{P1}$, and $[H_{I1}H_{I2}^{-1}H_{P2}H_{I3}]+H_{P1}$ of the parity-check matrix has full rank.

When the parity-check matrix of Equation (11) is used, at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]+H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}]$, $[([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

The puncturing unit 640 punctures part of the codeword under the control of the controller 610. The puncturing unit 640 punctures part of the information word in the codeword. For example, the puncturing unit 640 splits the information word into two partial information words, and punctures the first partial information word.

The codeword distributor 650 distributes the codeword including the second partial information word unpunctured and the parity to the respective antennas. That is, the codeword distributor 650 divides the punctured partial codeword into the plurality of the fragments, and outputs the codeword fragments to the respective transmit antenna paths.

For example, the codeword distributor 650 splits the parity into as many partial parities as the number of transmit antennas, outputs the other partial information word unpunctured and one partial parity to the first transmit antenna path, and outputs the other partial parities to the other transmit antenna paths. Herein, the length of the other partial parities equals the length of the other partial information word unpunctured and the one partial parity. The partial parity output to the first transmit antenna path together with the unpunctured information word includes the LSB of the codeword. Accordingly, the codeword distributor 650 first outputs the one partial parity and then outputs the punctured information word to the first transmit antenna path.

The modulators 660-1 through 660-N generate baseband signals by modulating the codeword according to a modulation scheme corresponding to the transmit antennas. The RF transmitters 670-1 through 670-N up-convert the baseband signals to RF signals, amplify the RF signals, and transmit the signals over the antennas.

Figure 7:
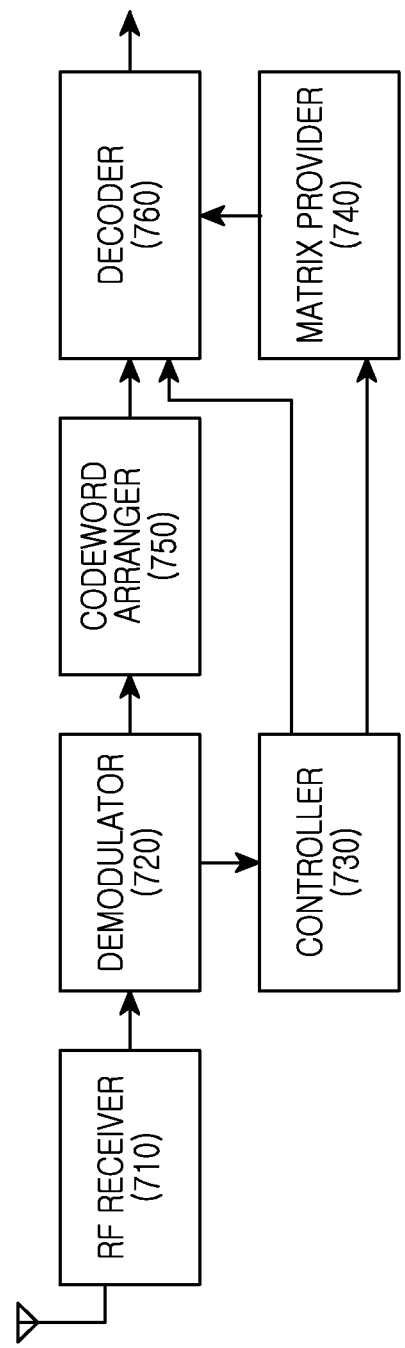
FIG. 7 is a block diagram illustrating a receiving node in a multiple antenna communication system according to an embodiment of the present invention.

FIG. 7 is a block diagram illustrating a receiving node in a multiple antenna communication system according to an embodiment of the present invention.

Referring to FIG. 7, the receiving node includes an RF receiver 710, a demodulator 720, a controller 730, a matrix provider 740, a codeword arranger 750, and a decoder 760.

The RF receiver 710 down-converts the RF signal received over at least one receive antenna to the baseband signal. The demodulator 720 demodulates the baseband signal and outputs the demodulated signal to the codeword arranger 750 and the controller 730.

The controller 730 determines the parity-check matrix used by the transmitting node from the signal output from the demodulator 720, and controls the matrix provider 740 to provide the determined parity-check matrix to the decoder 760. When the transmitting node applies the puncturing to the codeword, the controller 730 acquires puncturing pattern information from the signal output from the demodulator 720, and outputs the puncturing pattern information to the decoder 760. For example, the controller 730 can use a prestored puncturing pattern, determine the puncturing pattern according to a predefined rule, or determine the puncturing pattern using the information indicated by the transmitting node.

The matrix provider 740 forwards the parity-check matrix determined by the controller 730 to the decoder 760. For example, the matrix provider 740 can generate the parity-check matrix according to a predefined rule, load the parity-check matrix stored to a storage means, or provide the parity-check matrix notified by the transmitting node.

The codeword arranger 750 distinguishes the codeword fragments per transmit antenna of the transmitting node, and rearranges the codeword fragments distributed and transmitted per antenna from the transmitting node. More specifically, the codeword arranger 750 obtains the unpunctured information word and the first partial parity from the partial codeword transmitted over the first transmit antenna of the transmitting node, obtains the other partial parities from the partial codeword transmitted over at least one other transmit antenna, and rearranges the unpunctured information word and the partial parities. For example, the codeword arranger 750 rearranges the codeword in an order of the unpunctured information word, the other partial parities, and the first partial parity.

The decoder 760 decodes the codeword output from the codeword arranger 750 using the parity-check matrix output from the matrix provider 740. The decoder 760 determines the information word that makes the product of the parity-check matrix and the transpose matrix of the codeword zero. When part of the codeword is punctured, the decoder 760 decodes on the assumption that the probability of the punctured bit being 0 and the probability of the punctured bit being 1 are equal to ½, or decodes by erasing the punctured bit. For example, part of the information word in the codeword can be punctured.

The decoder 760 can use the parity-check matrix as shown in Equation (7) or Equation (11). When the parity-check matrix shown in Equation (7) is used, at least one of $[H_{I1} H_{I2}^{-1} H_{P2} H_{I3}]$, $H_{P1}$, and $[H_{I1} H_{I2}^{-1} H_{P3} H_{I3}] + H_{P1}$ of the parity-check matrix has full rank.

When the parity-check matrix shown in Equation (11) is used, at least one of $[H_{I1} H_{I2}^{-1} H_{P3} H_{I3}]$, $H_{P1}$, $H_{P2}$, $[H_{I1} H_{I2}^{-1} H_{P3} H_{I3}] + H_{P1}$, $[H_{I1} H_{I2}^{-1} H_{P3} H_{I3}] + H_{P2}$, $H_{P1} + H_{P2}$, $[H_{I1} H_{I2}^{-1} H_{P3} H_{I3}] + H_{P1} + H_{P2}$, $[H_{I1} H_{I2}^{-1} H_{P3} H_{I3} H_{P1}]$, $[H_{I1} H_{I2}^{-1} H_{P3} H_{I3} H_{P2}]$, $[H_{P1} H_{P2}]$, $[([H_{I1} H_{I2}^{-1} H_{P3} H_{I3}] + H_{P2}) H_{P1}]$, $[[H_{I1} H_{I2}^{-1} H_{P3} H_{I3}](H_{P2} + H_{P1})]$, $[([H_{I1} H_{I2}^{-1} H_{P3} H_{I3}] + H_{P1}) H_{P2}]$, and $[([H_{I1} H_{I2}^{-1} H_{P3} H_{I3}] + H_{P1})([H_{I1} H_{I2}^{-1} H_{P3} H_{I3}] + H_{P2})]$ has full rank.

As described above, a multiple antenna communication system carries out LDPC coding using a parity-check matrix that satisfies a condition for achieving maximum diversity. Therefore, good channel quality can be provided and the data transfer rate can be improved.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. An operating method of a transmitting node in a multiple-input multiple-output wireless communication system, the method comprising:
   determining a parity-check matrix;
   generating a codeword using the parity-check matrix;
   puncturing a part of an information word;
   dividing a parity into a plurality of partial parities based on a number of transmit antennas;
   transmitting an unpunctured part of the information word and a partial parity over a first antenna; and
   transmitting at least one other partial parity over at least one other transmit antenna.

2. The method of claim 1, wherein the at least one other partial parity has a same length as a total length of the information word and the partial parity.

3. The method of claim 2, wherein the transmitting the unpunctured part of the information word and the partial parity over the first antenna comprises:
   transmitting the partial parity first; and
   transmitting the unpunctured part of the information word second.

4. The method of claim 2, wherein the partial parity includes a Least Significant Bit (LSB) of the codeword.

5. The method of claim 2, wherein the parity-check matrix is given by:

$$H_B = \begin{bmatrix} H_{I1} & H_{I3} & H_{P1} & 0 \\ H_{I2} & 0 & 0 & H_{P2} \end{bmatrix},$$

where $H_B$ denotes the parity-check matrix, $H_{I1}$, $H_{I2}$, and $H_{I3}$ denote submatrices corresponding to partial information words, $H_{P1}$ and $H_{P2}$ denote submatrices corresponding to the partial parities, and $H_{I1}$ and $H_{I2}$ of the submatrices corresponding to the information word are submatrices corresponding to an untransmitted partial information word.

6. The method of claim 5, wherein at least one of $[H_{I1} H_{I2}^{-1} H_{P2} H_{I3}]$, $H_{P1}$, and $[H_{I1} H_{I2}^{-1} H_{P2} H_{I3}] + H_{P1}$ has full rank.

7. The method of claim 2, wherein the parity-check matrix is given by:

$$H_C = \begin{bmatrix} H_{I1} & H_{I3} & H_{P1} & H_{P2} & 0 \\ H_{I2} & 0 & 0 & 0 & H_{P3} \end{bmatrix},$$

where $H_C$ denotes the parity-check matrix, $H_{I1}$, $H_{I2}$, and $H_{I3}$ denote submatrices corresponding to partial information words, $H_{P1}$, $H_{P2}$ and $H_{P3}$ denote submatrices corresponding to the partial parities, and $H_{I1}$ and $H_{I2}$ are submatrices corresponding to an untransmitted information word.

8. The method of claim 7, wherein at least one of $[H_{I1} H_{I2}^{-1} H_{P3} H_{I3}]$, $H_{P1}$, $H_{P2}$, $[H_{I1} H_{I2}^{-1} H_{P3} H_{I3}] + H_{P1}$, $[H_{I1} H_{I2}^{-1} H_{P3} H_{I3}] + H_{P2}$, $H_{P1} + H_{P2}$, $[H_{I1} H_{I2}^{-1} H_{P3} H_{I3}] + H_{P1} + H_{P2}$, $[H_{I1} H_{I2}^{-1} H_{P3} H_{I3} H_{P1}]$, $[H_{I1} H_{I2}^{-1} H_{P3} H_{I3} H_{P2}]$, $[H_{P1} H_{P2}]$, $[([H_{I1} H_{I2}^{-1} H_{P3} H_{I3}] + H_{P2}) H_{P1}]$, $[[H_{I1} H_{I2}^{-1} H_{P3} H_{I3}](H_{P2} + H_{P1})]$, $[([H_{I1} H_{I2}^{-1} H_{P3} H_{I3}] + H_{P1}) H_{P2}]$, and $[([H_{I1} H_{I2}^{-1} H_{P3} H_{I3}] + H_{P1})([H_{I1} H_{I2}^{-1} H_{P3} H_{I3}] + H_{P2})]$ has full rank.

9. The method of claim 1, wherein encoding using the parity-check matrix comprises:
   determining the parity that makes a product of the parity-check matrix and a transpose matrix of the codeword equal zero.

10. An operating method of a receiving node in a multiple-input multiple-output wireless communication system, the method comprising:
  receiving a codeword with part of an information word punctured therefrom, over at least one receive antenna;
  obtaining an unpunctured part of the information word and a partial parity from the codeword transmitted over a first transmit antenna of a transmitting node;
  obtaining at least one other partial parity from part of the codeword transmitted over at least one other transmit antenna;
  rearranging the unpunctured part of the information word and the partial parities; and
  restoring the information word by decoding the rearranged codeword using a parity-check matrix used by the transmitting node.

11. The method of claim 10, wherein the at least one other partial parity has a same length as a total length of the unpunctured part of the information word and the partial parity.

12. The method of claim 11, wherein rearranging the unpunctured part of the information word and the partial parities comprises:
  rearranging in an order of the unpunctured part of the information word, the other partial parities, and the partial parity received over the first antenna.

13. The method of claim 11, wherein the parity-check matrix is given by:

$$H_B = \begin{bmatrix} H_{I1} & H_{I3} & H_{P1} & 0 \\ H_{I2} & 0 & 0 & H_{P2} \end{bmatrix},$$

where $H_B$ denotes the parity-check matrix, $H_{I1}$, $H_{I2}$, and $H_{I3}$ denote submatrices corresponding to partial information words, $H_{P1}$ and $H_{P2}$ denote submatrices corresponding to the partial parities, and $H_{I1}$ and $H_{I2}$ of the submatrices corresponding to the information word are submatrices corresponding to an untransmitted partial information word.

14. The method of claim 13, wherein at least one of $[H_{I1}H_{I2}^{-1}H_{P2}H_{I3}]$, $H_{P1}$, and $[H_{I1}H_{I2}^{-1}H_{P3}H_{I3}]+H_{P1}$ has full rank.

15. The method of claim 11, wherein the parity-check matrix is given by:

$$H_C = \begin{bmatrix} H_{I1} & H_{I3} & H_{P1} & H_{P2} & 0 \\ H_{I2} & 0 & 0 & 0 & H_{P3} \end{bmatrix},$$

where $H_C$ denotes the parity-check matrix, $H_{I1}$, $H_{I2}$, and $H_{I3}$ denote submatrices corresponding to partial information words, $H_{P1}$, $H_{P2}$ and $H_{P3}$ denote submatrices corresponding to the partial parities, and $H_{I1}$ and $H_{I2}$ are submatrices corresponding to an untransmitted information word.

16. The method of claim 15, wherein at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]+H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}]$, $[([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

17. The method of claim 10, wherein decoding the rearranged codeword comprises:
  determining an information word that makes a product of the parity-check matrix and a transpose matrix of the codeword equal zero.

18. An apparatus of a transmitting node in a multiple-input multiple-output wireless communication system, the apparatus comprising:
  a controller for determining a parity-check matrix;
  an encoder for generating a codeword using the parity-check matrix;
  a puncturing unit for puncturing part of an information word;
  a distributor for dividing a parity into partial parities based on a number of transmit antennas; and
  a transmitter for transmitting an unpunctured part of the information word and a partial parity over a first antenna, and transmitting at least one other partial parity over at least one other transmit antenna.

19. The apparatus of claim 18, wherein the at least one other partial parity has a same length as a total length of the information word and the partial parity.

20. The apparatus of claim 19, wherein the transmitter transmits the partial parity first and transmits the unpunctured part of the information word second, over the first transmit antenna.

21. The apparatus of claim 19, wherein the partial parity comprises a Least Significant Bit (LSB) of the codeword.

22. The apparatus of claim 19, wherein the parity-check matrix is given by:

$$H_B = \begin{bmatrix} H_{I1} & H_{I3} & H_{P1} & 0 \\ H_{I2} & 0 & 0 & H_{P2} \end{bmatrix},$$

where $H_B$ denotes the parity-check matrix, $H_{I1}$, $H_{I2}$, and $H_{I3}$ denote submatrices corresponding to partial information words, $H_{P1}$ and $H_{P2}$ denote submatrices corresponding to the partial parities, and $H_{I1}$ and $H_{I2}$ of the submatrices corresponding to the information word are submatrices corresponding to an untransmitted partial information word.

23. The apparatus of claim 22, wherein at least one of $[H_{I1}H_{I2}^{-1}H_{P2}H_{I3}]$, $H_{P1}$, and $[H_{I1}H_{I2}^{-1}H_{P3}H_{I3}]+H_{P1}$ has full rank.

24. The apparatus of claim 19, wherein the parity-check matrix is given by:

$$H_C = \begin{bmatrix} H_{I1} & H_{I3} & H_{P1} & H_{P2} & 0 \\ H_{I2} & 0 & 0 & 0 & H_{P3} \end{bmatrix},$$

where $H_C$ denotes the parity-check matrix, $H_{I1}$, $H_{I2}$, and $H_{I3}$ denote submatrices corresponding to partial information words, $H_{P1}$, $H_{P2}$ and $H_{P3}$ denote submatrices corresponding to the partial parities, and $H_{I1}$ and $H_{I2}$ are submatrices corresponding to an untransmitted information word.

25. The apparatus of claim 24, wherein at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]+H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}]$, $[([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

26. The apparatus of claim 18, wherein the encoder determines the parity that makes a product of the parity-check matrix and a transpose matrix of the codeword equal zero.

27. An apparatus of a receiving node in a multiple-input multiple-output wireless communication system, the apparatus comprising:
- a receiver for receiving a codeword with part of an information word punctured therefrom, over at least one receive antenna;
- an arranger for obtaining an unpunctured part of the information word and a partial parity from the codeword transmitted over a first transmit antenna of a transmitting node, obtaining at least one other partial parity from part of the codeword transmitted over at least one other transmit antenna, and rearranging the unpunctured part of the information word and the partial parities; and
- a decoder for restoring the information word by decoding the rearranged codeword using a parity-check matrix used by the transmitting node.

28. The apparatus of claim 27, wherein the at least one other partial parity has a same length as a total length of the unpunctured part of the information word and the partial parity.

29. The apparatus of claim 28, wherein the arranger rearranges the unpunctured part of the information word and the partial parities in an order of the unpunctured part of the information word, the other partial parities, and the partial parity received over the first antenna.

30. The apparatus of claim 28, wherein the parity-check matrix is given by:

$$H_B = \begin{bmatrix} H_{I1} & H_{I3} & H_{P1} & 0 \\ H_{I2} & 0 & 0 & H_{P2} \end{bmatrix},$$

where $H_B$ denotes the parity-check matrix, $H_{I1}$, $H_{I2}$, and $H_{I3}$ denote submatrices corresponding to partial information words, $H_{P1}$ and $H_{P2}$ denote submatrices corresponding to the partial parities, and $H_{I1}$ and $H_{I2}$ of the submatrices corresponding to the information word are submatrices corresponding to an untransmitted partial information word.

31. The apparatus of claim 30, wherein at least one of $[H_{I1}H_{I2}^{-1}H_{P2}H_{I3}]$, $H_{P1}$, and $[H_{I1}H_{I2}^{-1}H_{P2}H_{I3}]+H_{P1}$ has full rank.

32. The apparatus of claim 28, wherein the parity-check matrix is given by:

$$H_C = \begin{bmatrix} H_{I1} & H_{I3} & H_{P1} & H_{P2} & 0 \\ H_{I2} & 0 & 0 & 0 & H_{P3} \end{bmatrix},$$

where $H_c$ denotes the parity-check matrix, $H_{I1}$, $H_{I2}$, and $H_{I3}$ denote submatrices corresponding to partial information words, $H_{P1}$, $H_{P2}$ and $H_{P3}$ denote submatrices corresponding to the partial parities, and $H_{I1}$ and $H_{I2}$ are submatrices corresponding to an untransmitted information word.

33. The apparatus of claim 32, wherein at least one of $[H_{I1}H_{I2}^{-1}H_{P3}H_{I3}]$, $H_{P1}$, $H_{P2}$, $[H_{I1}H_{I2}^{-1}H_{P3}H_{I3}]+H_{P1}$, $[H_{I1}H_{I2}^{-1}H_{P3}H_{I3}]H_{P2}$, $H_{P1}+H_{P2}$, $[H_{I1}H_{I2}^{-1}H_{P3}H_{I3}]+H_{P1}+H_{P2}$, $[H_{I1}H_{I2}^{-1}H_{P3}H_{I3}H_{P1}]$, $[H_{I1}H_{I2}^{-1}H_{P3}H_{I3}H_{P2}]$, $[H_{P1}H_{P2}]$, $[([H_{I1}H_{I2}^{-1}H_{P3}H_{I3}]+H_{P2})H_{P1}]$, $[[H_{I1}H_{I2}^{-1}H_{P3}H_{I3}](H_{P2}+H_{P1})]$, $[([H_{I1}H_{I2}^{-1}H_{P3}H_{I3}]+H_{P1})H_{P2}]$, and $[([H_{I1}H_{I2}^{-1}H_{P3}H_{I3}]+H_{P1})([H_{I1}H_{I2}^{-1}H_{P3}H_{I3}]+H_{P2})]$ has full rank.

34. The apparatus of claim 27, wherein the decoder determines an information word that makes a product of the parity-check matrix and a transpose matrix of the codeword equal zero.

* * * * *